US012572066B2

(12) United States Patent
Tae et al.

(10) Patent No.: US 12,572,066 B2
(45) Date of Patent: Mar. 10, 2026

(54) EXTREME ULTRAVIOLET SOURCE TEMPERATURE MONITORING USING CONFOCAL SENSOR

(71) Applicant: KLA Corporation, Milpitas, CA (US)

(72) Inventors: Patrick Tae, San Jose, CA (US); Caijun Su, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 51 days.

(21) Appl. No.: 18/538,977

(22) Filed: Dec. 13, 2023

(65) Prior Publication Data

US 2024/0201581 A1      Jun. 20, 2024

Related U.S. Application Data

(60) Provisional application No. 63/432,772, filed on Dec. 15, 2022.

(51) Int. Cl.
| | |
|---|---|
| *G03F 1/84* | (2012.01) |
| *G03F 1/24* | (2012.01) |
| *G03F 7/00* | (2006.01) |

(52) U.S. Cl.
CPC .................. *G03F 1/84* (2013.01); *G03F 1/24* (2013.01); *G03F 7/70033* (2013.01)

(58) Field of Classification Search
CPC .................................................. G03F 7/70033
See application file for complete search history.

(56) References Cited

U.S. PATENT DOCUMENTS

| | | | |
|---|---|---|---|
| 8,711,346 | B2 | 4/2014 | Stokowski |
| 8,785,082 | B2 | 7/2014 | Xiong et al. |
| 8,838,407 | B2 | 9/2014 | Schmitz-Hubsch |
| 8,916,831 | B2 | 12/2014 | Wang |
| 8,953,869 | B2 | 2/2015 | Nasser-Ghodsi et al. |

(Continued)

FOREIGN PATENT DOCUMENTS

JP          5102139 B2      12/2012

OTHER PUBLICATIONS

Korean Intellectual Property Office, International Search Report and Written Opinion received in International Application No. PCT/US2023/084175, Apr. 22, 2024, 7 pages.

*Primary Examiner* — Thanh Luu
(74) *Attorney, Agent, or Firm* — Suiter Swantz IP

(57)          ABSTRACT
A broadband light source includes a confocal sensor assembly configured to measure a surface of a rotatable drum coated with plasma-forming target material. The broadband light source includes a laser source configured to direct pulsed illumination to the rotatable drum for exciting the plasma-forming target material and emitting broadband light as the drum is rotated in an angular direction and translated in an axial direction. The broadband light source includes a controller configured to direct the confocal sensor assembly to transmit a confocal optical signal to the rotatable drum, record a calibration measurement of a distance from the confocal sensor assembly to the rotatable drum, direct a cryogenic cooling sub-system to cryogenically cool the rotatable drum, record one or more distance measurements from a sensor head to the rotatable drum, convert the distance measurements to temperature values, and determine whether a target process condition temperature is achieved.

22 Claims, 8 Drawing Sheets

400

402 — MOUNTING A CONFOCAL SENSOR ASSEMBLY WITH AN EXTERNAL LIGHT SOURCE IN VACUUM PROXIMATE TO A ROTATING DRUM

404 — TRANSMITTING A CONFOCAL OPTICAL SIGNAL FROM THE CONFOCAL SENSOR ASSEMBLY TO THE ROTATING DRUM, FOR MEASURING A SURFACE OF THE ROTATING DRUM

406 — RECORDING A CALIBRATION MEASUREMENT OF A DISTANCE FROM THE CONFOCAL SENSOR ASSEMBLY TO THE ROTATING DRU AT A FIRST TEMPERATURE

408 — CRYOGENICALLY COOLING THE ROTATABLE DRUM

410 — RECORDING, CONTINUOUSLY, DISTANCE MEASUREMENTS TO THE ROTATING DRUM DURING THE CRYOGENIC COOLING OF THE ROTATING DRUM

412 — CONVERTING THE DISTANCE MEASUREMENTS INTO TEMPERATURE VALUES REPRESENTATIVE OF THE TEMPERATURE OF THE DRUM MATERIAL DURING THE CRYOGENIC COOLING

414 — IDENTIFYING THE ATTAINMENT OF A TARGET PROCESS CONDITION TEMPERATURE BY THE ROTATING DRUM BASED ON THE CONVERTED TEMPERATURE VALUES

(56)  References Cited

U.S. PATENT DOCUMENTS

| | | | |
|---|---|---|---|
| 2010/0296106 A1* | 11/2010 | Gates | G02B 27/0075 |
| | | | 356/614 |
| 2015/0076359 A1* | 3/2015 | Bykanov | H05G 2/0088 |
| | | | 250/504 R |
| 2017/0248416 A1 | 8/2017 | Sakai et al. | |
| 2021/0136903 A1 | 5/2021 | Kuritsyn et al. | |
| 2022/0028712 A1 | 1/2022 | Prasad et al. | |
| 2024/0090110 A1 | 3/2024 | Tae et al. | |

* cited by examiner

400

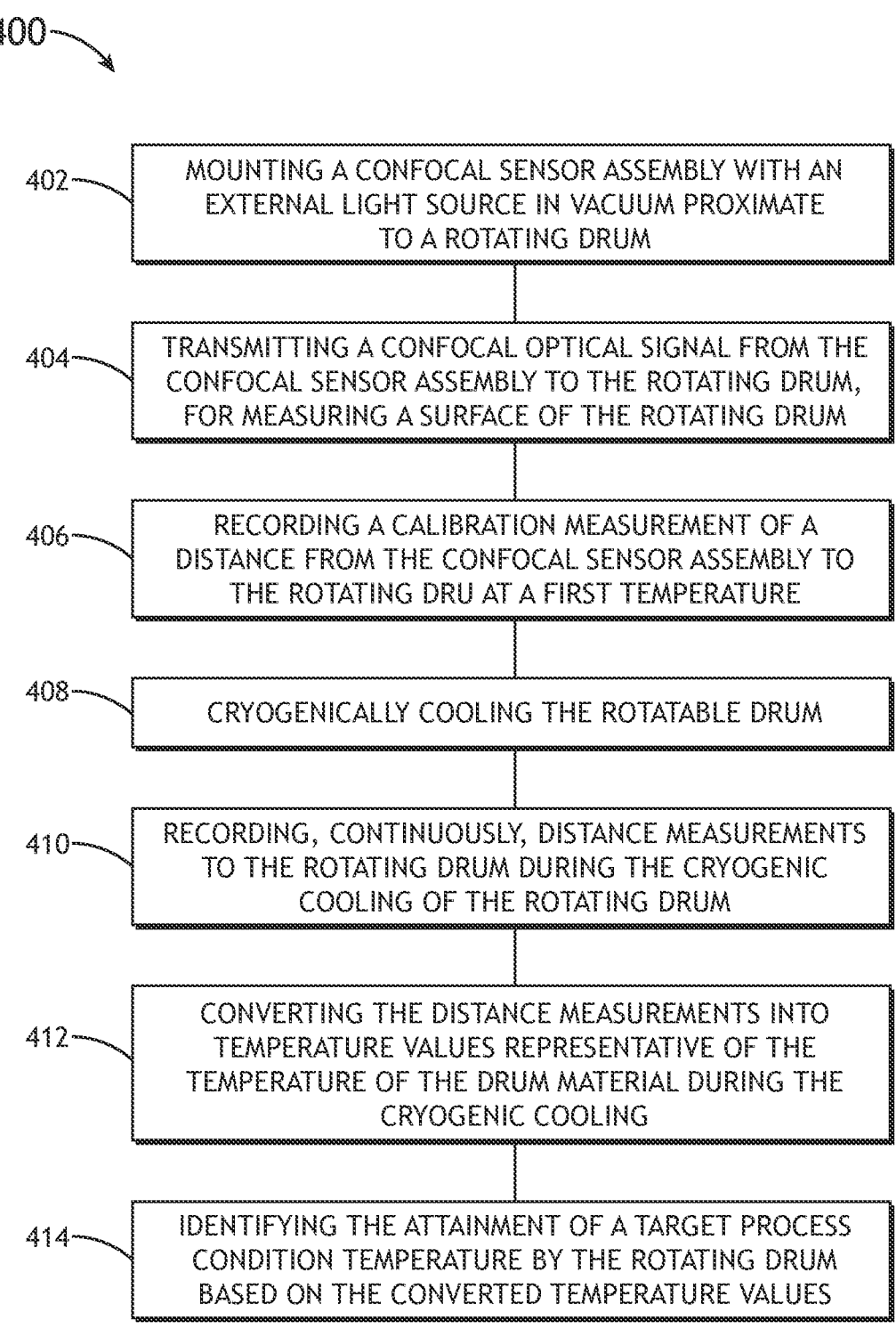

402 — MOUNTING A CONFOCAL SENSOR ASSEMBLY WITH AN EXTERNAL LIGHT SOURCE IN VACUUM PROXIMATE TO A ROTATING DRUM

404 — TRANSMITTING A CONFOCAL OPTICAL SIGNAL FROM THE CONFOCAL SENSOR ASSEMBLY TO THE ROTATING DRUM, FOR MEASURING A SURFACE OF THE ROTATING DRUM

406 — RECORDING A CALIBRATION MEASUREMENT OF A DISTANCE FROM THE CONFOCAL SENSOR ASSEMBLY TO THE ROTATING DRU AT A FIRST TEMPERATURE

408 — CRYOGENICALLY COOLING THE ROTATABLE DRUM

410 — RECORDING, CONTINUOUSLY, DISTANCE MEASUREMENTS TO THE ROTATING DRUM DURING THE CRYOGENIC COOLING OF THE ROTATING DRUM

412 — CONVERTING THE DISTANCE MEASUREMENTS INTO TEMPERATURE VALUES REPRESENTATIVE OF THE TEMPERATURE OF THE DRUM MATERIAL DURING THE CRYOGENIC COOLING

414 — IDENTIFYING THE ATTAINMENT OF A TARGET PROCESS CONDITION TEMPERATURE BY THE ROTATING DRUM BASED ON THE CONVERTED TEMPERATURE VALUES

FIG.4

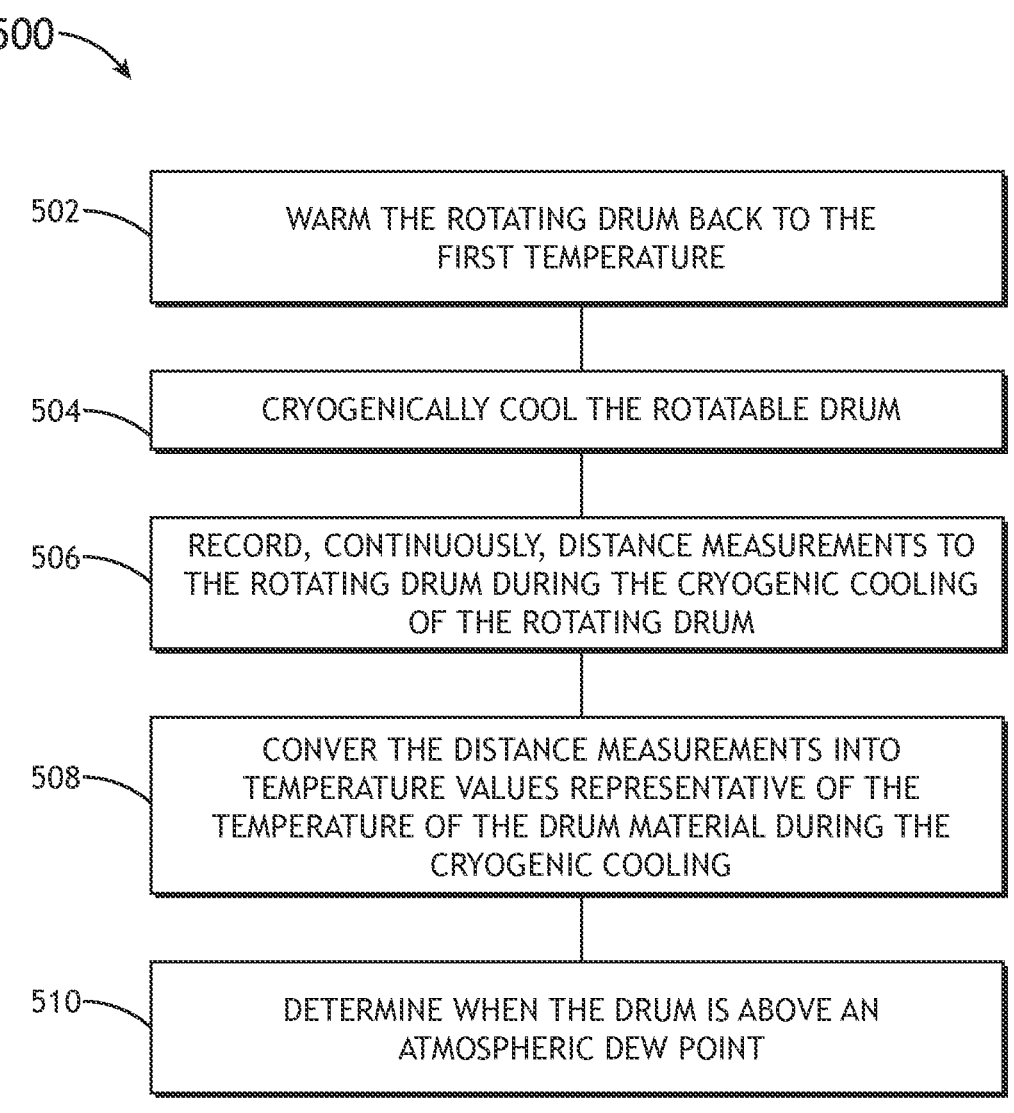

500

502 — WARM THE ROTATING DRUM BACK TO THE FIRST TEMPERATURE

504 — CRYOGENICALLY COOL THE ROTATABLE DRUM

506 — RECORD, CONTINUOUSLY, DISTANCE MEASUREMENTS TO THE ROTATING DRUM DURING THE CRYOGENIC COOLING OF THE ROTATING DRUM

508 — CONVER THE DISTANCE MEASUREMENTS INTO TEMPERATURE VALUES REPRESENTATIVE OF THE TEMPERATURE OF THE DRUM MATERIAL DURING THE CRYOGENIC COOLING

510 — DETERMINE WHEN THE DRUM IS ABOVE AN ATMOSPHERIC DEW POINT

FIG.5

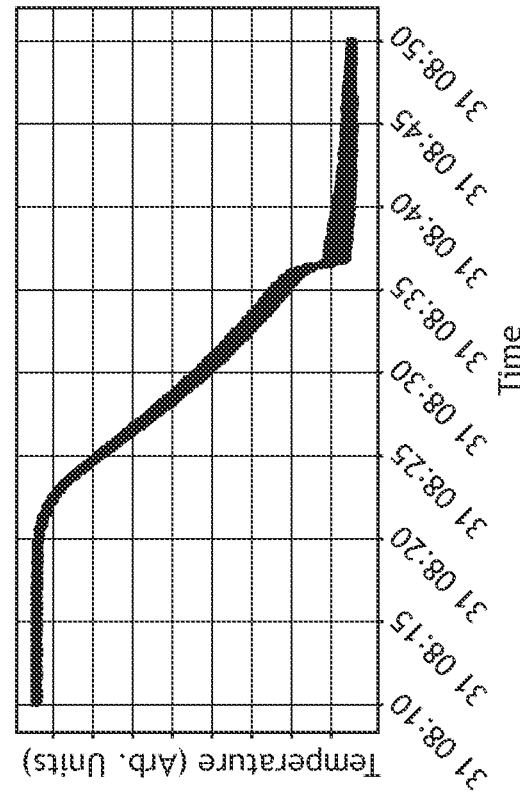
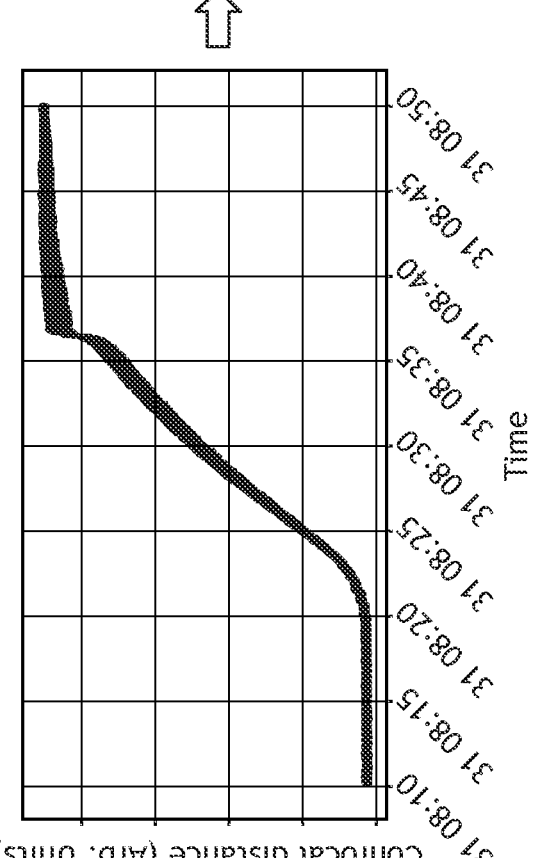
FIG.6

EXTREME ULTRAVIOLET SOURCE TEMPERATURE MONITORING USING CONFOCAL SENSOR

CROSS-REFERENCE TO RELATED APPLICATIONS

The present application claims the benefit under 35 U.S.C. § 119(e) of U.S. Provisional Patent Application Ser. No. 63/432,772, filed Dec. 15, 2022, titled "EUV Source Temperature Monitoring Using Confocal Sensor", naming Patrick Tae and Caijun Su as inventors, which is incorporated herein by reference in the entirety.

TECHNICAL FIELD

The present disclosure relates generally to generation of broadband illumination and, more particularly, to a system and method for generating broadband illumination via a pulsed laser and a rotatable drum covered in target material.

BACKGROUND

As the demand for lithography-based device structures having ever-smaller features continues to increase, the need for improved illumination sources used for inspection of the associated reticles that lithographically print these ever-shrinking devices continues to grow. One such illumination source includes an extreme ultraviolet (EUV) light source. One method of creating EUV light includes spinning a drum coated with a uniformly thick layer of solid (frozen) plasma-forming target material, such as xenon, and exposing the xenon-coated portion of the cylinder with a pulsed laser suitable for exciting the xenon to generate plasma. Inspection tools used in this context typically operate at the same wavelength used for imaging, which creates a challenge of providing a reliable source of short-wavelength EUV light that meets the system-level specifications. Traditionally, the inspection of the drum in EUV sources relied on infrared pyrometry and thermocouples combined with thermal modeling. Infrared pyrometry, however, encounters limitations stemming from the low emissivity of the copper drum target material. Additionally, this approach proves to be challenging when obtaining accurate temperature readings at cryogenic temperatures, specifically below −50 degrees Celsius. The alternative approach involving thermocouples combined with thermal modeling presents its own set of challenges. The inherent difficulty arises from the lack of effective coupling between the thermocouples and the dynamically moving drum target, which operates along two independent axes. This makes it difficult to establish a reliable correlation between temperature measurements and the actual temperature of the drum target, impeding the accuracy and efficiency of the inspection process.

Therefore, it is desirable to provide a method and system that cure the deficiencies of the previous approaches identified above.

SUMMARY

A broadband light source is disclosed, in accordance with one or more illustrative embodiments of the present disclosure. In one illustrative embodiment, the broadband light source includes a rotatable drum at least partially coated with plasma-forming target material. In another illustrative embodiment, the broadband light source includes a confocal sensor assembly including a sensor head and a light source for measuring a surface of the rotating drum. In another illustrative embodiment, the broadband light source includes a laser source configured to direct pulsed illumination to a material-coated portion of the rotatable drum for exciting the plasma-forming target material and emitting broadband light as the rotatable drum is rotated in an angular direction and translated in an axial direction. In another illustrative embodiment, the broadband light source includes a controller comprising one or more processors configured to execute program instructions stored in memory. In another illustrative embodiment, the program instructions are configured to cause the one or more processors to direct the confocal sensor assembly to transmit a confocal optical signal to the rotating drum. In another illustrative embodiment, the program instructions are configured to cause the one or more processors to record a calibration measurement of a distance from the confocal sensor assembly to the rotating drum at a first temperature. In another illustrative embodiment, the program instructions are configured to cause the one or more processors to direct a cryogenic cooling sub-system to cryogenically cool the rotatable drum. In another illustrative embodiment, the program instructions are configured to cause the one or more processors to record one or more distance measurements from the sensor head to the rotatable drum during the cryogenic cooling of the rotating drum. In another illustrative embodiment, the program instructions are configured to cause the one or more processors to convert the one or more distance measurements to one or more temperature values representative of the temperature of a material of the rotatable drum during the cryogenic cooling of the rotatable drum. In another illustrative embodiment, the program instructions are configured to cause the one or more processors to determine whether a target process condition temperature of the rotating drum is achieved based on the converted temperature values.

A characterization system is disclosed, in accordance with one or more illustrative embodiments of the present disclosure. In one illustrative embodiment, the characterization system includes an illumination sub-system. In another illustrative embodiment, the illumination sub-system includes a rotatable drum at least partially coated with plasma-forming target material. In another illustrative embodiment, the illumination sub-system includes a confocal sensor assembly including a sensor head and a light source for measuring a surface of the rotatable drum. In another illustrative embodiment, the illumination sub-system includes a laser source configured to direct pulsed illumination to a material-coated portion of the rotatable drum for exciting the plasma-forming target material and emitting broadband light as the rotatable drum is rotated in an angular direction and translated in an axial direction. In another illustrative embodiment, the characterization system includes one or more collection optics configured to collect illumination emanated from a plasma generated in response to the excitation of the plasma-forming target material. In another illustrative embodiment, the characterization system includes a set of illuminator optics configured to direct illumination from the one or more collection optics to one or more samples disposed on a stage. In another illustrative embodiment, the characterization system includes a detector. In another illustrative embodiment, the characterization system includes a set of projection optics configured to receive illumination from the surface of the one or more samples and direct the illumination from the one or more samples to the detector.

A method is disclosed, in accordance with one or more illustrative embodiments of the present disclosure. In one illustrative embodiment, the method may include, but is not limited to, rotating a rotatable drum coated with a plasma-forming target material. In another illustrative embodiment, the method may include, but is not limited to, directing a confocal sensor assembly to transmit a confocal optical signal to the rotatable drum. In another illustrative embodiment, the method may include, but is not limited to, recording a calibration measurement of a distance from the confocal sensor assembly to the rotatable drum at a first temperature. In another illustrative embodiment, the method may include, but is not limited to, directing a cryogenic cooling sub-system to cryogenically cool the rotatable drum. In another illustrative embodiment, the method may include, but is not limited to, recording one or more distance measurements from the sensor head to the rotatable drum during the cryogenic cooling of the rotatable drum. In another illustrative embodiment, the method may include, but is not limited to, converting the one or more distance measurements to one or more temperature values representative of the temperature of a material of the rotatable drum during the cryogenic cooling of the rotatable drum. In another illustrative embodiment, the method may include, but is not limited to, determining whether a target process condition temperature of the rotatable drum is achieved based on the converted temperature values.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 4 illustrates a flow diagram depicting a method for determining a temperature of a drum target via a confocal sensor assembly, in accordance with one or more embodiments of the present disclosure.

FIG. 5 illustrates a flow diagram depicting a method for determining when the temperature of the drum target exceeds an atmospheric dew point via the confocal sensor assembly, in accordance with one or more embodiments of the present disclosure.

FIG. 6 illustrates continuous temperature metrics determined for the drum target based on a confocal distance of the confocal sensor assembly, in accordance with one or more embodiments of the present disclosure.

DETAILED DESCRIPTION

Figure 1A:
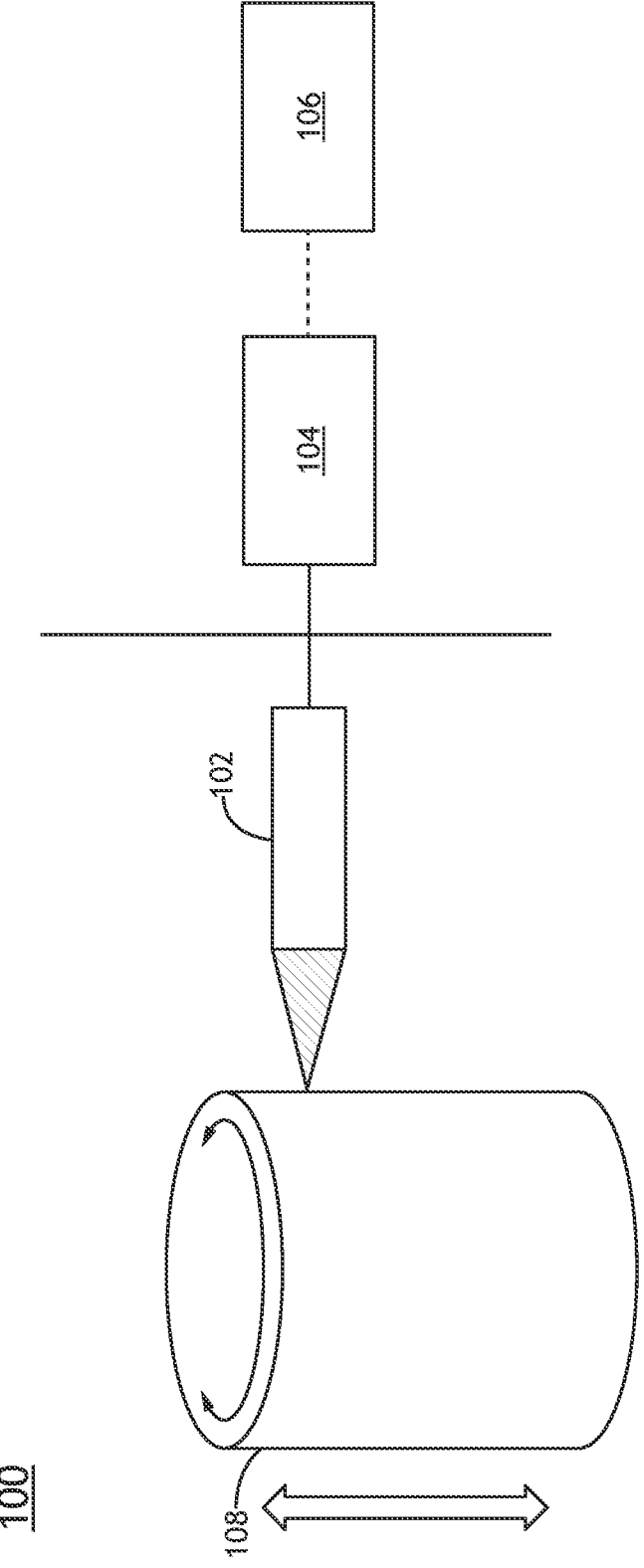
FIG. 1A illustrates a conceptual view of a confocal sensor assembly integrated within a rotatable drum-based broadband light source, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

FIGS. 1A through 7 generally illustrate embodiments of a system and method for determining a drum target temperature, in accordance with one or more embodiments of the present disclosure.

Embodiments of the present disclosure are directed to the exposure of a rotating drum (e.g., cylinder) covered in plasma-forming material (e.g., frozen xenon or carbon dioxide), which may be excited via an illumination source (e.g., pulsed laser) to emit broadband light (e.g., broadband EUV light or soft x-ray light). Embodiments of the present disclosure are directed to a confocal sensor assembly integrated within a xenon ice-based EUV source to enhance productivity and uptime in semiconductor photomask inspection, specifically those designed for use in EUV lithography. These masks, intricate in their geometries, require advanced inspection systems operating at the same wavelength employed for imaging. This creates a challenge of providing a dependable source of short-wavelength Extreme Ultraviolet (EUV) light which satisfies the system-level specifications. To mitigate downtime and optimize operational efficiency, embodiments of this disclosure introduce a metrology approach which determines, in real-time, a process condition temperature of the plasma-based rotatable drum, even in the absence of ice. This capability proves to be valuable during various critical phases of tool operation. For example, during the source bring-up phase, the temperature of the drum serves as a dynamic indicator, allowing precise determination of when the drum has reached the required temperature for growing and maintaining ice. This real time measurement eliminates reliance on temperature sensors that may not be directly coupled to the drum. By way of another example, during the source maintenance phase, determining the temperature of the drum may help to reduce green-to-green time by determining a safe point in time to vent the chamber and expose the drum to the atmosphere. This improves traditional approaches that rely on predetermined wait times, which include significant margins to accommodate variations in tool and environmental conditions. By way of another example, during an unexpected downtime, a temperature measurement of the drum may provide critical information to assess the status of the system. This allows for informed decisions to be made on whether to vent or continue operating the drum, facilitating quicker system recovery compared to lacking such feedback. By way of another example, determining the temperature of the rotatable drum as it is rotating and translating may provide valuable insight for research and development purposes, as it may provide a characterization of thermally induced stress and strain in the drum during cooling and warming processes. Understanding the relationship between drum deformation and temperature may provide a basis for hardware design iterations and optimization of process conditions for the source operation.

Figure 1B:
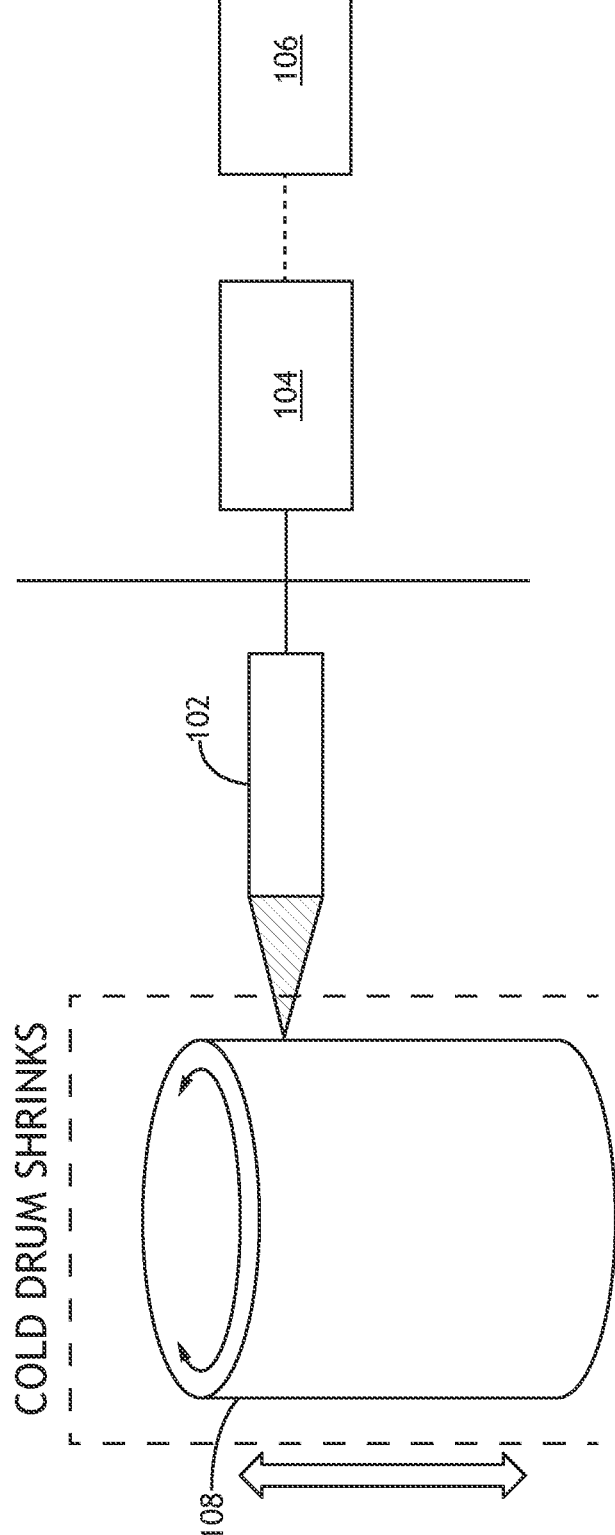
FIG. 1B illustrates a conceptual view of a confocal sensor assembly integrated within a cryogenically cooled rotatable drum-based broadband light source, in accordance with one or more embodiments of the present disclosure.

FIGS. 1A-1B illustrate a conceptual view of a confocal sensor assembly 100 integrated within a rotatable drum-based broadband light source, in accordance with one or more embodiments of the present disclosure.

In embodiments, the broadband source 200 includes a confocal sensor assembly 100, a rotatable drum 108, and a controller 106 including one or more processors and memory. For example, the confocal sensor assembly 100 may be positioned proximate to a rotatable drum 108, for measuring a surface of the drum 108. In embodiments, the confocal sensor assembly 100 may include a sensor head 102. For example, the sensor head 102 may be mounted in a vacuum environment while maintaining a proximity to the rotating drum 108.

In embodiments, the confocal sensor assembly 100 may include a light source 104. For example, the light source 104 may be positioned external from the sensor head 102 and the vacuum environment. In embodiments, the light source 104 is configured to emit light in a direction towards the surface of the rotating drum 108. For example, the light source 104 is designed to produce a specific wavelength of light suitable for confocal metrology measurements. For instance, this wavelength may be tailored to the characteristics of the drum material and the measurement environment.

In embodiments, the light source 104 may include, but is not limited to, one or more broadband light sources. For example, the one or more light sources may include, but are not limited to, one or more flashlamps or one or more LEDs. It is noted that the confocal assembly 100 may utilize controlled chromatic aberration observed within the broadband light source of the confocal assembly 100 to measure the distance from the sensor head 102 to the surface of the drum 108. Further, the specific type of light source 104 chosen may be adapted to optimize performance under cryogenic conditions and other operation states of the rotating drum 108. By way of another example, the sensor head 102 may be configured to emit and receive light signals. In embodiments, the sensor head 102 includes confocal optics used to ensure that the emitted and received light signals share a common focal point at the surface of the drum 108. This confocal arrangement enhances measurement accuracy by selectively capturing only the light reflected from the focal plane. In embodiments, the sensor head 102 may adopt various configurations to optimize its performance in different operational conditions. For instance, the sensor head 102 may include adaptive optics or variable focal length elements to accommodate variations in the rotational and translational movements of the rotatable drum 108.

In embodiments, the confocal sensor assembly 100 is communicatively coupled to the controller 106 including the one or more processors and memory. For example, the one or more processors may be communicatively coupled to the memory, such that the one or more processors are configured to execute a set of program instructions stored on the memory. In embodiments, the one or more processors are configured to direct the sensor head 102 to transmit a confocal optical signal to a surface of the rotatable drum 108. In embodiments, the one or more processors are configured to direct the light source to emit light in a direction toward the surface of the rotatable drum 108.

Figure 2:
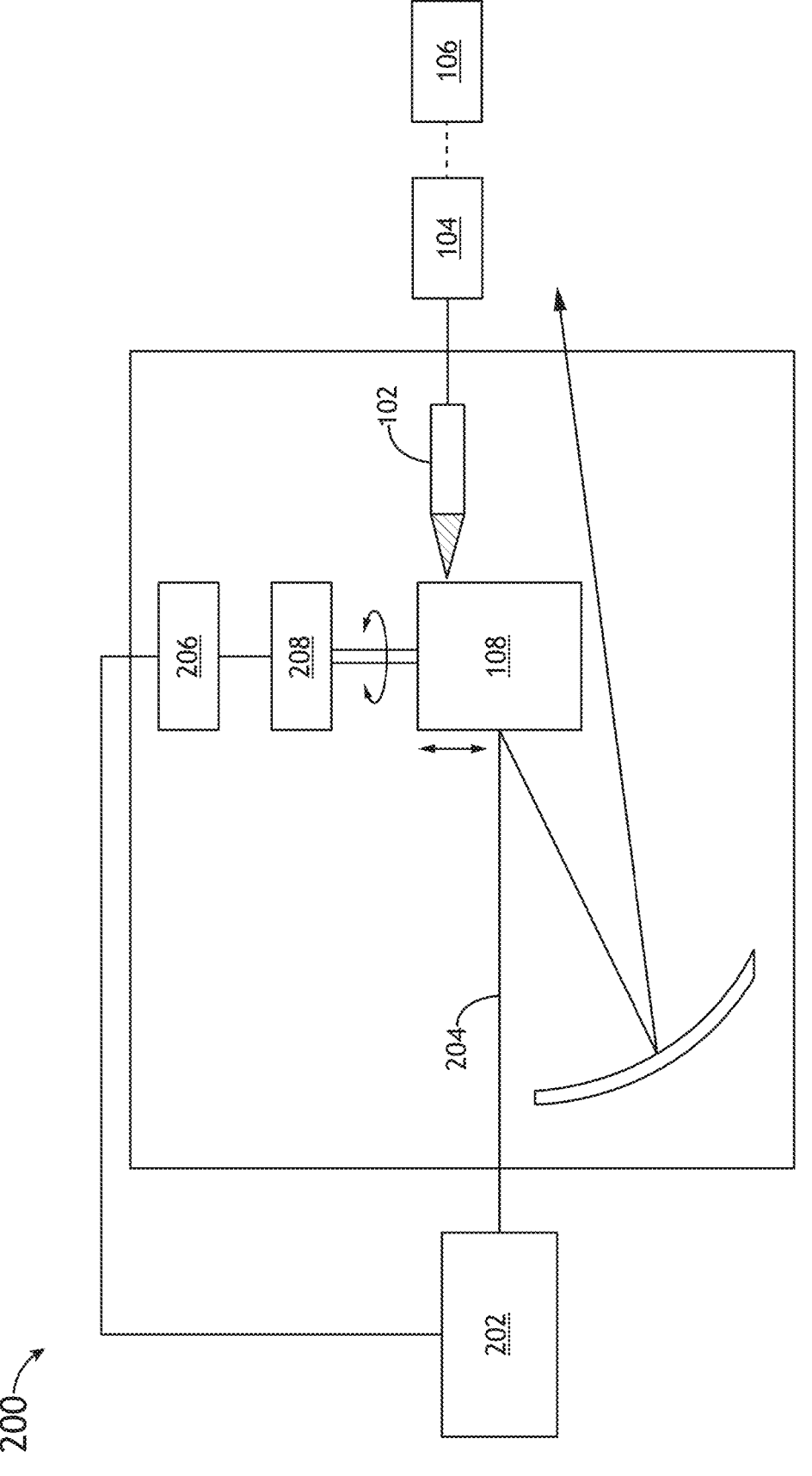
FIG. 2 illustrates a conceptual view of a drum-based broadband light source equipped with the confocal sensor assembly, in accordance with one or more embodiments of the present disclosure.

FIG. 2 illustrates a conceptual view of a drum-based broadband light source 200 equipped with the confocal sensor assembly 100, in accordance with one or more embodiments of the present disclosure.

In embodiments, the broadband source 200 includes a rotatable drum 108 suitable for rotation about an axis. For example, the drum 108 may be a cylinder, as shown in FIG. 1A. In other embodiments, the drum 108 includes any cylindrically-symmetric shape known in the art. For example, the drum 108 may include, but is not limited to, a cylinder, a cone, a sphere, an ellipsoid and the like. Further, the drum 108 may include a composite shape consisting of two or more shapes. It is noted herein that, for the purposes of descriptive convenience, embodiments of the present disclosure are described in the context of a rotatable drum or rotating drum 108, as depicted in FIG. 1A, however, this embodiment should not be interpreted as a limitation on the scope of the present disclosure.

In embodiments, the drum 108 is coated with a plasma-forming target material. For example, the target material may include a solid disposed on the surface of the drum 108. The plasma-forming target material may include any material known in the art that generates plasma when excited by an illumination source and subsequently emits broadband light. The broadband light emitted by the plasma may include, but is not limited to, broadband soft x-ray light, broadband EUV light, broadband DUV light, broadband VUV light, broadband UV light, broadband visible light, and/or broadband IR light. By way of another example, the target material may include, but is not limited to, xenon frozen onto the surface of the drum 108. It is noted that the utilization of frozen xenon as a target material may be particularly useful in the context of generating broadband EUV light. By way of another example, the target material may include, but is not limited to, carbon dioxide frozen onto the surface of the drum 108. It is noted that the utilization of frozen carbon dioxide as a target material may be particularly useful in the context of generating broadband soft x-ray light.

In embodiments, the broadband source 200 includes a pulsed illumination source 202. The pulsed illumination source 202 may include any pulsed or modulated illumination source known in the art. For example, the pulsed source 202 may include a pulsed laser. Further, the pulsed illumination source 202 is suitable for initiating and/or maintaining a plasma in the material of the rotatable drum. For example, the pulsed illumination source 202 may include, but is not limited to, one or more infrared (IR) lasers. For instance, the pulsed illumination source 202 may include, but is not limited to, one or more CO2 lasers.

In embodiments, the broadband source 200 includes one or more actuators configured to actuate the drum 108 rotationally and axially. In embodiments, the broadband source 200 includes a rotational actuator 206 configured to rotate the drum 108 about an axis. The rotational actuator 206 may include any rotational actuator known in the art including, but not limited to, one or more servo motors. Additionally, the broadband source 200 may include a linear actuator 208 configured to translate the drum 108 along an axial direction (e.g., vertical direction in the example shown in FIG. 1A). It is recognized herein that the present disclosure is not limited to the rotational and linear actuators 206, 208 in FIG. 2. As such, the description provided above should be interpreted merely as illustrative. For instance, the pulsed source 202 may be disposed on an actuating stage (not shown), which provides translation of the pulsed illumination 204 relative to the drum 108.

The axial motion imparted by the linear actuator 208 and the rotational motion of the drum 108 caused by the rotational actuator 206 allows for tracing of the pulsed illumination 204 across the surface of the drum 108. In embodiments, the controller 106 may control the triggering of the pulsed laser source 202 and/or actuation of the drum 108 along the rotational direction and/or axial direction. In this regard, the controller 106 may direct the actuators 206, 208 and the drum 108 to trace the pulsed illumination 204 across the surface of the cylinder, as the cylinder rotates and axially translates, in any manner described in the present disclosure.

In embodiments, the broadband source 200 may include a cryogenic cooling sub-system to cool the rotating drum 108. For example, the cryogenic cooling sub-system may include a heat exchanger, a cryogenic fluid and/or a circulation system. In embodiments, the cryogenic fluid may include, but is not limited to, liquid nitrogen, liquid helium, liquid argon, liquid carbon dioxide, liquid hydrogen, and/or liquid oxygen. For example, the one or more processors of the controller 106 may be configured to direct the cryogenic cooling sub-system to circulate the selected cryogenic fluid through the heat exchanger. For example, the heat exchanger may absorb heat from the rotating drum, causing the cryogenic fluid to vaporize. As the cryogenic fluid vaporizes, it absorbs heat from the rotating drum 108, causing the temperature of the drum to decrease. The vaporized coolant is then returned to the circulation system for recooling.

In embodiments, the broadband source 200 may include a heating sub-system. For example, the heating sub-system may include one or more heating elements configured to heat the rotatable drum back to a calibration temperature or other desired level. The one or more heating elements may include, but are not limited to, an electric heating element (e.g., one or more resistive heaters) a radiant heating element (e.g., one or more quartz infrared heaters), or an induction heating element (e.g., one or more induction heating coils). In embodiments, the one or more heating elements may be positioned around the rotating drum 108.

In embodiments, the broadband source 200 may include a plurality of controllers to manage various operations of the broadband source 200. For example, the plurality of controllers may include at least one of a motion controller, a process controller, and/or a laser controller to collectively handle functions including, but not limited to, drum actuation, process control, and laser triggering. It is noted herein that the broadband source 200 is not limited to a plurality of controllers; however, a single controller 106 may be configured to execute the functions of the plurality of controllers mentioned above, as needed.

Figure 3:
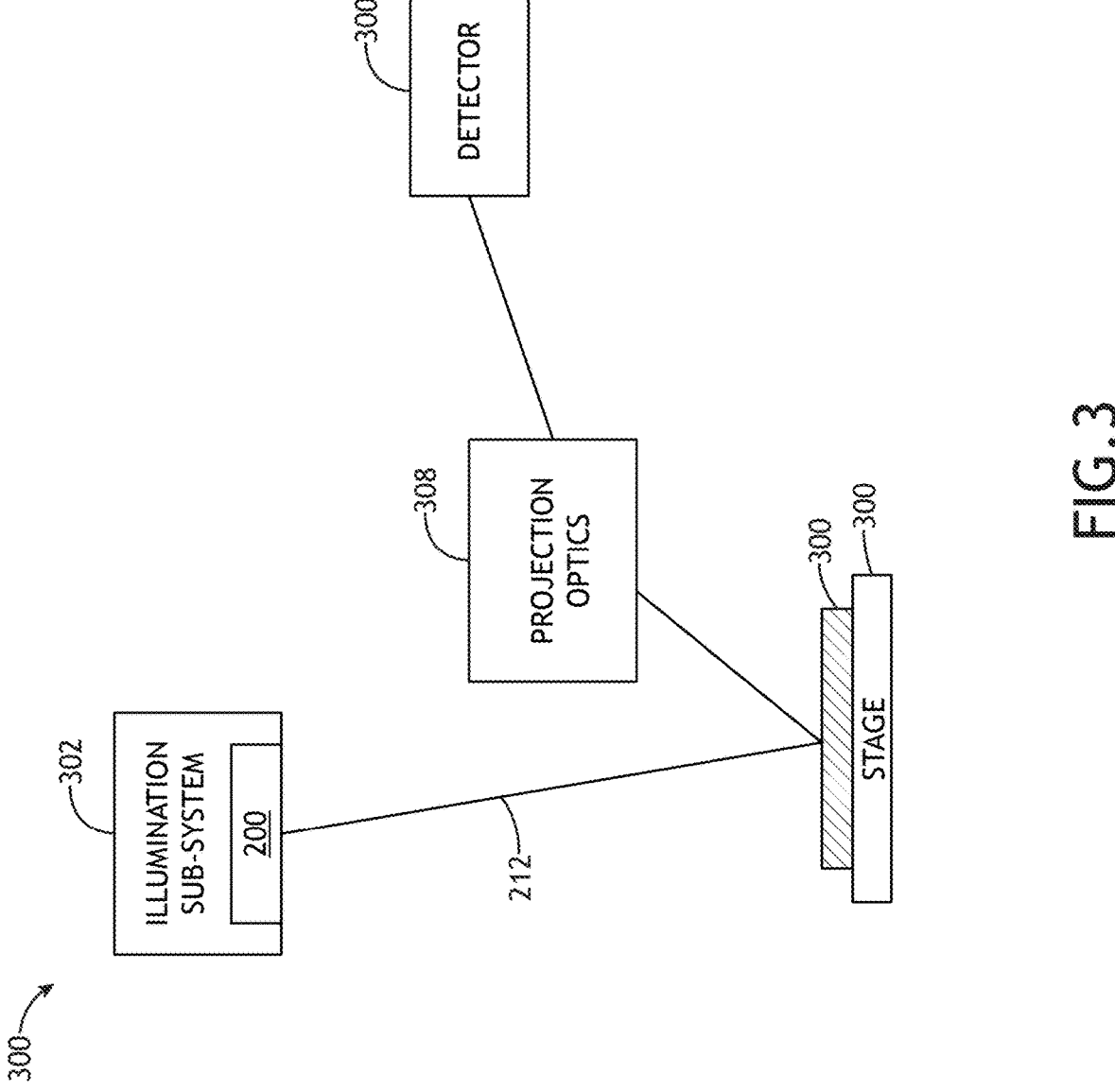
FIG. 3 illustrates a block diagram view of an inspection system incorporating the broadband light source, in accordance with one or more embodiments of the present disclosure.

FIG. 3 illustrates a block diagram view of an inspection system 300 incorporating a plasma-based illumination source 200, in accordance with one or more embodiments of the present disclosure. In embodiments, the system 300 includes an illumination sub-system 302. The illumination sub-system 302 may incorporate the broadband source 200 described throughout the present disclosure. In embodiments, although not shown in FIG. 3, the system 300 includes a set of illuminator optics. In embodiments, the illuminator optics may direct illumination 109 emanating from the broadband source 200 to one or more samples 304 disposed on a sample stage 306. For example, the one or more samples 304 may include, but are not limited to, a wafer (e.g., semiconductor wafer). By way of another example, the one or more samples 304 may include but are not limited to, a reticle or photomask. In embodiments, the system 300 includes one or more detectors 310. In embodiments, the system 300 includes a set of projection optics 308 suitable for collecting light scattered, reflected, diffracted, or otherwise emanating from the specimen and directing the light to the one or more detectors (e.g., CCD, TDI-CCD, PMT and the like). In embodiments, the controller 106 may be integrated within the system 300 for receiving and/or analyzing the measurement results from the detector 310.

It is noted herein that the one or more components of system 300 may be communicatively coupled to the various other components of the system 300 in any manner known in the art. For example, the broadband light source 200, detector 310, controller 106, and one or more processors may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

In embodiments, the inspection system 300 is configured as a wafer inspection system or a reticle/photomask inspection system. For example, the inspection system 300 may include any wafer or reticle/photomask inspection optical architecture known in the art suitable for operating in the EUV spectral range. By way of another example, the inspection system 300 may include any wafer or reticle/photomask inspection optical architecture known in the art suitable for operating in the soft x-ray spectral range. It is further recognized that the inspection system 300 may be configured as an EUV mask or mask blank inspection system. EUV-based mask blank inspection is described generally in U.S. Pat. No. 8,711,346 to Stokowski, issued on Apr. 29, 2014, which is incorporated herein by reference in the entirety. EUV-based mask blank inspection is described generally in U.S. Pat. No. 8,785,082 to Xiong et al., issued on Jul. 22, 2014, which is incorporated herein by reference in the entirety. EUV-based reticle inspection is generally described in U.S. Pat. No. 8,953,869 to Nasser-Ghodsi et al., issued on Feb. 10, 2015, which is incorporated herein by reference in the entirety.

In embodiments, the broadband source 200 described throughout the present disclosure may be implemented within an optical lithography system. In embodiments, the optical lithography system may include a set of illuminator optics configured to direct output light from the Broadband source 200 to an EUV-compatible lithography mask (e.g., EUV reflective mask) or a soft x-ray-compatible lithography mask. In embodiments, the optical lithography system includes a set of projection optics configured to receive illumination reflected from the mask and direct the reflected illumination from the mask to one or more wafers disposed on a wafer stage. The optical lithography system may include any broadband lithography system known in the art. EUV-based lithography is described generally in U.S. Pat. No. 8,916,831 to Wang, issued on Dec. 23, 2014 which is incorporated herein by reference in the entirety.

FIG. 4 illustrates a flow diagram depicting a method 400 for determining a temperature of a drum target via a confocal sensor assembly, in accordance with one or more embodiments of the present disclosure.

In a step 402, a confocal optical signal is transmitted from the confocal sensor assembly to a surface of the rotatable drum. For example, the controller 106 may direct the sensor head 102 of the confocal sensor assembly 100 to transmit the confocal optical signal to the rotatable drum 108.

In a step 404, a calibration measurement is recorded of a distance from the sensor head to the surface of the rotatable drum at a first temperature. For example, the sensor head 102 may be configured to communicate the calibration measurement with the controller 106. Further, the memory of the controller 206 may be configured to store the recorded calibration measurement and the corresponding temperature associated with the calibration measurement.

In a step 406, the rotatable drum is cryogenically cooled. For example, the one or more processors of the controller 106 may be configured to direct the cryogenic cooling sub-system to cool the rotatable drum 108 to a predetermined temperature.

In a step 408, the sensor head is configured to continuously monitor a confocal distance to the rotating drum from the sensor head during the cryogenic cooling. For example, the sensor head 102 is configured to transmit continuous confocal optical signals to the rotatable drum 108 to monitor the temperature of the surface of the rotating drum 108. Further, the sensor head 102 is configured to communicate the continuous measurements to the controller 106, which is configured to store the data in memory.

In a step 410, the continuously recorded distance measurements are converted into temperature values representative of the temperature of the drum material during the cryogenic cooling. For example, the one or more processors of the controller 106 are configured to derive a temperature of the rotatable drum 108 from the communicated distance measurements received from the sensor head 102.

In a step 412, it is determined whether a target process condition temperature of the surface of the rotatable drum is achieved based on the converted temperature value. For example, the controller 106 may be configured to continuously monitor the temperature readings provided by the confocal sensor assembly. Further, once a temperature reading is received which meets or exceeds a predefined target temperature for the rotatable drum 108, then the controller 106 may interpret this as the achievement of the target condition.

FIG. 5 illustrates a flow diagram depicting a method for determining when the temperature of the drum target is above an atmospheric dew point via the confocal sensor assembly, in accordance with one or more embodiments of the present disclosure.

In a step 502, the rotating drum is warmed back to the first temperature. For example, the drum 108 is warmed via a heating sub-system, the heating sub-system may include one or more heating elements configured to heat the rotatable drum 108. By way of another example, the one or more heating elements may include at least one of an electric heating element, a radiant heating element, or an induction heating system.

In a step 504, the rotatable drum is cryogenically cooled. For example, the cryogenic cooling of the rotatable drum 108 is achieved via a cryogenic fluid, the cryogenic fluid including at least one of liquid nitrogen, liquid helium, liquid argon, liquid carbon dioxide, liquid hydrogen, or liquid oxygen.

In a step 506, distance measurements to the rotating drum from the sensor head are continuously recorded during the cryogenic cooling. For example, the sensor head 102 is configured to transmit continuous confocal optical signals to the rotatable drum 108 to monitor the temperature of a surface of the rotating drum 108. Further, the sensor head 102 is configured to communicate the continuous measurements to the controller 106, which is configured to store the data in memory.

In embodiments, the controller 106 analyzes an intensity of the confocal optical signals of the one or more temperature values and determines a presence of ice on the rotatable drum. For example, the controller 106 may determine a presence of ice based on variations in the confocal optical signal intensity.

In a step 508, the continuous distance measurements are converted into temperature values representative of the temperature of the drum material during the cryogenic cooling. For example, program instructions stored in the memory of the controller 106 are configured to cause the one or more processors to derive a temperature of the rotatable drum 108 from the recorded distance measurements.

In a step 510, an atmospheric dew point temperature of the rotatable drum is determined. For example, the controller 106 may be configured to determine when the surface of the rotating drum 108 exceeds a temperature that is equivalent to the atmospheric dew point.

FIG. 6 illustrates continuous temperature metrics determined for the drum target based on a confocal distance of the confocal sensor assembly, in accordance with one or more embodiments of the present disclosure. For example, as the rotatable drum is cryogenically cooled, the confocal distance from the sensor head 102 to the surface of the rotatable drum 108 is changing due to deformation of the rotatable drum 108. Further, the temperature of the rotatable drum 108 may be derived from the confocal distance measurements of the rotatable drum 108 that are recorded.

Figure 7:
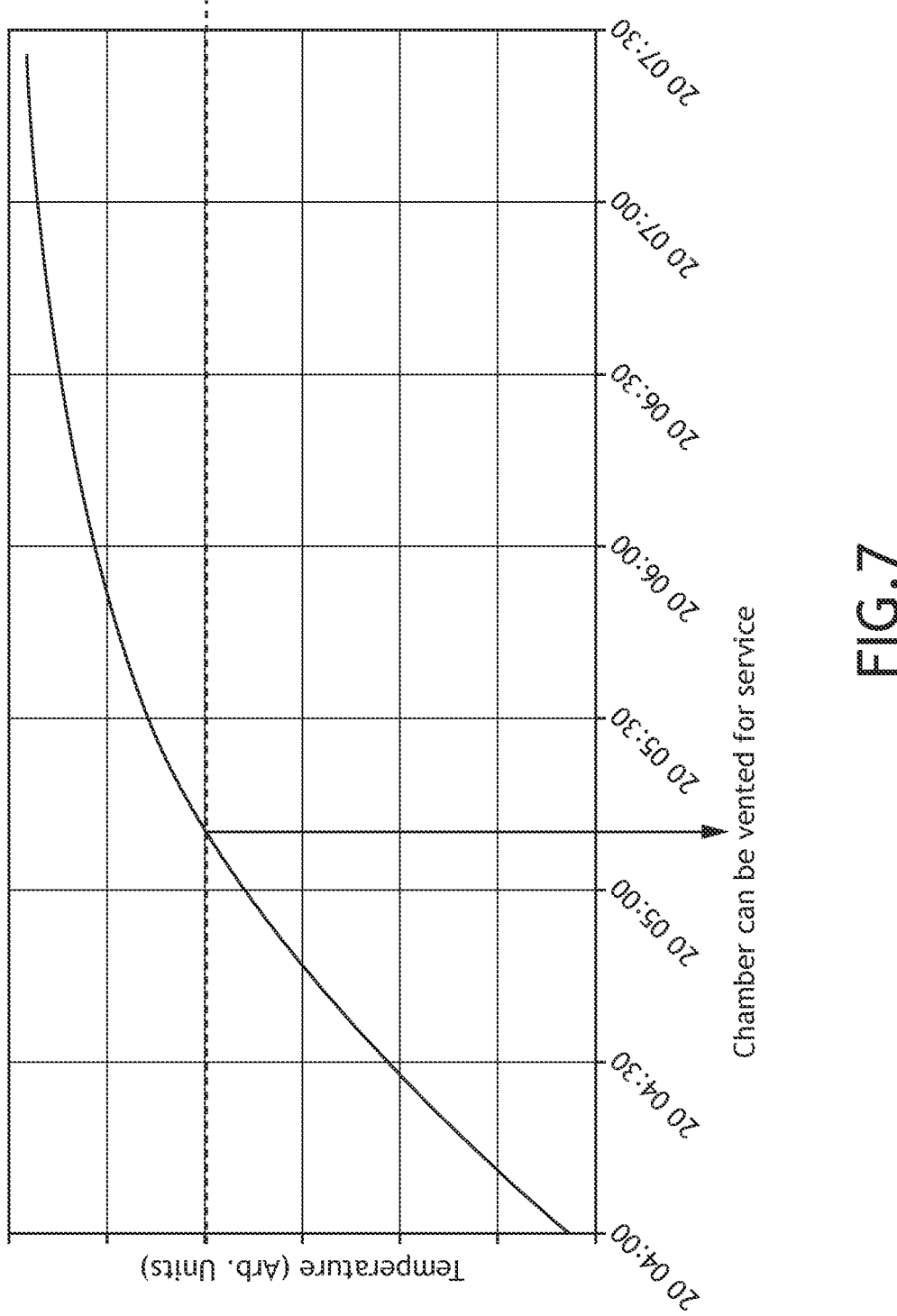
FIG. 7 illustrates temperature metrics of the drum target for determining when the temperature of the drum target is above an atmospheric dew point, in accordance with one or more embodiments of the present disclosure.

FIG. 7 illustrates temperature metrics of the drum target for determining when the temperature of the drum target is above an atmospheric dew point, in accordance with one or more embodiments of the present disclosure. In embodiments, an atmospheric dew point temperature may be stored in the memory of the controller 106. For example, once the temperature of the rotatable drum 108 reaches or exceeds the atmospheric dew point temperature, then the chamber may be safely vented for service.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide.

It is believed that the present disclosure and many of its attendant advantages will be understood by the foregoing description, and it will be apparent that various changes may be made in the form, construction, and arrangement of the components without departing from the disclosed subject matter or without sacrificing all its material advantages. The form described is merely explanatory, and it is the intention of the following claims to encompass and include such changes. Furthermore, it is to be understood that the invention is defined by the appended claims.

What is claimed:

1. A broadband light source comprising:
a rotatable drum at least partially coated with plasma-forming target material;
a confocal sensor assembly including a sensor head and a light source for measuring a surface of the rotatable drum;
a laser source configured to direct pulsed illumination to a material-coated portion of the rotatable drum for exciting the plasma-forming target material and emitting broadband light as the rotatable drum is rotated in an angular direction and translated in an axial direction; and
a controller comprising one or more processors configured to execute program instructions stored in memory, wherein the program instructions are configured to cause the one or more processors to:
direct the confocal sensor assembly to transmit a confocal optical signal to the rotatable drum;
record a calibration measurement of a distance from the confocal sensor assembly to the rotatable drum at a first temperature;
direct a cryogenic cooling sub-system to cryogenically cool the rotatable drum;
record one or more distance measurements from the sensor head to the rotatable drum during the cryogenic cooling of the rotatable drum;
convert the one or more distance measurements to one or more temperature values representative of a temperature of a material of the rotatable drum during the cryogenic cooling of the rotatable drum; and
determine whether a target process condition temperature of the rotatable drum is achieved based on the converted temperature values.

2. The broadband light source of claim 1, wherein recording the one or more distance measurements to the rotatable drum includes continuously recording the one or more distance measurements during the cryogenic cooling of the rotatable drum.

3. The broadband light source of claim 1, further comprising a heating sub-system for the rotatable drum, the heating sub-system comprising one or more heating elements configured to heat the rotatable drum.

4. The broadband light source of claim 3, wherein the one or more heating elements comprise at least one of an electric heating element, a radiant heating element, or an induction heating system.

5. The broadband light source of claim 3, wherein the one or more processors are further configured to:
direct the heating sub-system to warm the rotatable drum back to the first temperature, via the one or more heating elements;
direct the cryogenic cooling sub-system to cryogenically cool the rotatable drum;
record the one or more distance measurements from the sensor head to the rotatable drum during the cryogenic cooling of the rotatable drum;
convert the one or more distance measurements to the one or more temperature values representative of the temperature of the material of the rotatable drum during the cryogenic cooling of the rotatable drum; and
determine when the rotatable drum is above an atmospheric dew point.

6. The broadband light source of claim 1, wherein the one or more processors are further configured to:
analyze an intensity of the confocal optical signal of the one or more temperature values; and
determine a presence of ice on the rotatable drum based on variations in the confocal optical signal intensity.

7. The broadband light source of claim 1, wherein the first temperature is set at a calibration temperature for the calibration measurement.

8. The broadband light source of claim 1, wherein the cryogenic cooling of the rotatable drum is achieved via a cryogenic fluid, the cryogenic fluid including at least one of liquid nitrogen, liquid helium, liquid argon, liquid carbon dioxide, liquid hydrogen, or liquid oxygen.

9. A characterization system comprising:
an illumination sub-system, wherein the illumination sub-system comprises:
a rotatable drum at least partially coated with plasma-forming target material;
a confocal sensor assembly including a sensor head and a light source for measuring a surface of the rotatable drum; and
a laser source configured to direct pulsed illumination to a material-coated portion of the rotatable drum for exciting the plasma-forming target material and emitting broadband light as the rotatable drum is rotated in an angular direction and translated in an axial direction;
one or more collection optics configured to collect illumination emanated from a plasma generated in response to an excitation of the plasma-forming target material;
a set of illuminator optics configured to direct the illumination from the one or more collection optics to one or more samples disposed on a stage;
a detector; and
a set of projection optics configured to receive the illumination from the surface of the one or more samples and direct the illumination from the one or more samples to the detector; and
a controller comprising one or more processors configured to execute program instructions stored in memory, wherein the program instructions are configured to cause the one or more processors to:
direct the confocal sensor assembly to transmit a confocal optical signal to the rotatable drum;
record a calibration measurement of a distance from the confocal sensor assembly to the rotatable drum at a first temperature;
direct a cryogenic cooling sub-system to cryogenically cool the rotatable drum;
convert one or more distance measurements to one or more temperature values representative of a temperature of a material of the rotatable drum during the cryogenic cooling of the rotatable drum; and
determine whether a target process condition temperature of the rotatable drum is achieved based on the converted one or more temperature values.

10. The characterization system of claim 9, wherein the program instructions are configured to cause the one or more processors to:
record the one or more distance measurements from the sensor head to the rotatable drum during the cryogenic cooling of the rotatable drum.

11. The characterization system of claim 10, wherein recording the one or more distance measurements to the rotatable drum includes continuously recording the one or more distance measurements during the cryogenic cooling of the rotatable drum.

12. The characterization system of claim 10, further comprising a heating sub-system for the rotatable drum, the heating sub-system comprising one or more heating elements configured to heat the rotatable drum.

13. The characterization system of claim 12, wherein the one or more heating elements comprise at least one of an electric heating element, a radiant heating element, or an induction heating system.

14. The characterization system of claim 12, wherein the one or more processors are further configured to:

direct the heating sub-system to warm the rotatable drum back to the first temperature, via the one or more heating elements;

direct a cryogenic cooling sub-system to cryogenically cool the rotatable drum;

record one or more distance measurements from the sensor head to the rotatable drum during the cryogenic cooling of the rotatable drum;

convert the one or more distance measurements to one or more temperature values representative of a temperature of a material of the rotatable drum during the cryogenic cooling of the rotatable drum; and determine when the rotatable drum is above an atmospheric dew point.

15. The characterization system of claim 10, wherein the one or more processors are further configured to:

analyze an intensity of the confocal optical signal of the one or more temperature values; and determine a presence of ice on the rotatable drum based on variations in the confocal optical signal intensity.

16. The characterization system of claim 10, wherein the first temperature is set at a calibration temperature for the calibration measurement.

17. The characterization system of claim 10, wherein the cryogenic cooling of the rotatable drum is achieved via a cryogenic fluid, the cryogenic fluid including at least one of liquid nitrogen, liquid helium, liquid argon, liquid carbon dioxide, liquid hydrogen, or liquid oxygen.

18. A method comprising:

directing a confocal sensor assembly to transmit a confocal optical signal to a rotatable drum;

recording a calibration measurement of a distance from the confocal sensor assembly to the rotatable drum at a first temperature;

directing a cryogenic cooling sub-system to cryogenically cool the rotatable drum;

recording one or more distance measurements from a sensor head to the rotatable drum during the cryogenic cooling of the rotatable drum;

converting the one or more distance measurements to one or more temperature values representative of a temperature of a material of the rotatable drum during the cryogenic cooling of the rotatable drum; and determining whether a target process condition temperature of the rotatable drum is achieved based on the converted one or more temperature values.

19. The method of claim 18, further comprising:

directing a heating sub-system to warm the rotatable drum back to the first temperature, via one or more heating elements;

directing the cryogenic cooling sub-system to cryogenically cool the rotatable drum;

recording the one or more distance measurements from the sensor head to the rotatable drum during the cryogenic cooling of the rotatable drum;

converting the one or more distance measurements to the one or more temperature values representative of the temperature of the material of the rotatable drum during the cryogenic cooling of the rotatable drum; and determining when the rotatable drum is above an atmospheric dew point.

20. The method of claim 18, wherein the cryogenic cooling of the rotatable drum is achieved via a cryogenic fluid, the cryogenic fluid including at least one of liquid nitrogen, liquid helium, liquid argon, liquid carbon dioxide, liquid hydrogen, or liquid oxygen.

21. The method of claim 18, further comprising:

analyzing an intensity of the confocal optical signal of the one or more temperature values; and determining a presence of ice on the rotatable drum based on variations in the confocal optical signal intensity.

22. The method of claim 18, wherein the first temperature is set at a calibration temperature for the calibration measurement.

* * * * *